(12) United States Patent
Andreev et al.

(10) Patent No.: US 8,156,391 B2
(45) Date of Patent: Apr. 10, 2012

(54) DATA CONTROLLING IN THE MBIST CHAIN ARCHITECTURE

(75) Inventors: Alexandre Andreev, San Jose, CA (US); Anatoli Bolotov, Cupertino, CA (US); Mikhail Grinchuk, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 630 days.

(21) Appl. No.: 12/167,305

(22) Filed: Jul. 3, 2008

(65) Prior Publication Data
US 2009/0300440 A1 Dec. 3, 2009

Related U.S. Application Data

(60) Provisional application No. 61/056,172, filed on May 27, 2008, provisional application No. 61/056,246, filed on May 27, 2008, provisional application No. 61/059,882, filed on Jun. 9, 2008.

(51) Int. Cl.
G11C 29/14 (2006.01)
G11C 29/50 (2006.01)

(52) U.S. Cl. ........................................ 714/718; 714/724
(58) Field of Classification Search ........................ None
See application file for complete search history.

(56) References Cited

U.S. PATENT DOCUMENTS

| | | | | |
|---|---|---|---|---|
| 4,517,512 A * | 5/1985 | Petrich et al. | .................. | 714/724 |
| 4,929,889 A * | 5/1990 | Seiler et al. | .................. | 714/731 |
| 5,051,997 A | 9/1991 | Sakashita et al. | ............ | 371/22.4 |
| 5,535,164 A | 7/1996 | Adams et al. | .................. | 365/201 |
| 5,742,557 A | 4/1998 | Gibbins et al. | ........... | 365/230.05 |
| 5,896,330 A | 4/1999 | Gibson | .......................... | 365/201 |
| 6,014,336 A | 1/2000 | Powell et al. | .................. | 365/201 |
| 6,070,256 A | 5/2000 | Wu et al. | ......................... | 714/718 |
| 6,288,969 B1 | 9/2001 | Gibbins et al. | ........... | 365/230.05 |
| 6,347,056 B1 | 2/2002 | Ledford et al. | .............. | 365/201 |
| 6,587,979 B1 | 7/2003 | Kraus et al. | ................... | 714/720 |
| 6,681,358 B1 | 1/2004 | Karimi et al. | ................. | 714/733 |
| 6,941,494 B1 | 9/2005 | Andreev et al. | .............. | 714/718 |
| 7,010,736 B1 | 3/2006 | Teh et al. | ...................... | 714/733 |
| 7,028,240 B1 | 4/2006 | Bautista, Jr. et al. | ......... | 714/733 |
| 7,062,694 B2 | 6/2006 | Caty et al. | ..................... | 714/733 |
| 7,139,204 B1 | 11/2006 | Behera | .......................... | 365/201 |
| 7,203,873 B1 | 4/2007 | Adams et al. | .................. | 714/718 |
| 7,653,854 B2 | 1/2010 | Anzou et al. | .................. | 714/733 |
| 7,773,439 B2 * | 8/2010 | Do et al. | ........................ | 365/201 |
| 7,814,385 B2 * | 10/2010 | Bahl | ............................. | 714/733 |
| 2002/0104051 A1 | 8/2002 | Gupta | ............................ | 714/733 |
| 2002/0174394 A1 | 11/2002 | Ledford et al. | ............... | 714/733 |

(Continued)

OTHER PUBLICATIONS

Deng, Li-Ming, et al., "A Parallel Built-In Diagnostic Scheme for Multiple Embedded Memories", Records of the 2004 International Workshop on Memory Technology, Design and Testing (MTDT'04), 2004 IEEE, pp. 1-5.

(Continued)

*Primary Examiner* — Jeffrey A Gaffin
*Assistant Examiner* — Dipakkumar Gandhi
(74) *Attorney, Agent, or Firm* — Christopher P. Maiorana, PC

(57) ABSTRACT

A memory collar including a first circuit and a second circuit. The first circuit may be configured to generate one or more data sequences in response to one or more test commands. The one or more data sequences may be presented to a memory during a test mode. The second circuit may be configured to pre-process one or more outputs generated by the memory in response to the one or more data sequences.

29 Claims, 6 Drawing Sheets

U.S. PATENT DOCUMENTS

| | | | |
|---|---|---|---|
| 2002/0188902 A1 | 12/2002 | Fan et al. | 714/724 |
| 2004/0181303 A1* | 9/2004 | Walmsley | 700/115 |
| 2005/0028058 A1 | 2/2005 | Perner | 714/718 |
| 2005/0138514 A1 | 6/2005 | Burdine et al. | 714/733 |
| 2005/0246602 A1 | 11/2005 | Bahl et al. | 714/733 |
| 2006/0156134 A1 | 7/2006 | Mukherjee et al. | 714/733 |
| 2006/0242521 A1 | 10/2006 | Hii et al. | 714/733 |
| 2007/0220389 A1 | 9/2007 | Sato | 714/733 |
| 2008/0077834 A1 | 3/2008 | Khoche et al. | 714/732 |
| 2008/0126892 A1* | 5/2008 | Dubey et al. | 714/718 |
| 2008/0282119 A1 | 11/2008 | Suzuki et al. | 714/718 |

OTHER PUBLICATIONS

Huang, D.C., et al., "Short Papers—A Parallel Transparent BIST Method for Embedded Memory Arrays by Tolerating Redundant Operations", IEEE Transactions on Computer-Aided Design of Integrated Circuits and Systems, vol. 21, No. 5, May 2002, pp. 617-628.

* cited by examiner

DATA CONTROLLING IN THE MBIST CHAIN ARCHITECTURE

This application claims the benefit of U.S. Provisional Application Nos. 61/056,172 and 61/056,246, filed May 27, 2008, and 61/059,882, filed Jun. 9, 2008, which are hereby incorporated by reference in their entirety.

FIELD OF THE INVENTION

The present invention relates to memory architectures generally and, more particularly, to a method and/or apparatus for controlling data in a MBIST chain architecture.

BACKGROUND OF THE INVENTION

Conventional methods for at-speed parallel built-in self test (BIST) for memories of different types involve (i) separate MBIST controllers for each memory, (ii) parallel testing of (almost) identical memories with partial data compressing, (iii) shared controllers, but testing memories one-by-one and (iv) testing memories in the same way as regular logic. The conventional techniques have disadvantages including (i) a large number of gates, (ii) wide interconnection busses, (iii) placement limitations (i.e., controllers must be placed near memories), (iv) slow testing and (v) non-reusable BIST solutions for each new memory vendor.

SUMMARY OF THE INVENTION

The present invention concerns a memory collar including a first circuit and a second circuit. The first circuit may be configured to generate one or more data sequences in response to one or more test commands. The one or more data sequences may be presented to a memory during a test mode. The second circuit may be configured to pre-process one or more outputs generated by the memory in response to the one or more data sequences.

The objects, features and advantages of the present invention include providing a method and/or apparatus for controlling data in a MBIST chain architecture that may (i) provide at-speed on-chip memory testing, (ii) provide parallel testing of a wide variety of memories, (iii) provide built-in support of testing and diagnostic operation modes, (iv) be easily implemented, (v) provide flexibility to make extensions for new tests and/or types of memories, (vi) allow parallel testing of all memories with single controller, (vii) use moderate width busses (e.g., 8-10 bits wide) for connecting a controller with memory collars, (viii) implement pipelined busses, (ix) provide suppression of signal distortion by allowing insertion of extra flip-flops, (x) use data encoding to allow at-speed testing of memories, (xi) allow new tests and new memory types to be added easily and often without influence on earlier designed components, (xii) provide low complexity of memory collars connected to memories, (xiii) support different testing and/or diagnostic modes (e.g., testing memories for correctness, testing particular output bit of a particular memory, observe the data sequence of the particular bit, etc.) and/or (xiv) be reused for built-in self repair (BISR) solutions.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Testing of VLSI designs becomes more and more difficult as designs grow in complexity. Testing should be very accurate to reduce the number of non-detected faults. Testing should also be fast and inexpensive in terms of hardware and software overhead. Testing memories is an especially important task, because to reduce memory sizes, gates and wires are typically placed very densely. Densely placing gates and wires may result in a significantly higher (up to 4 times) ratio of faults. Because memories are very regular structures, testing may be done on-chip, based on data sequences generated by relatively small processors. Such a processor may, for example, produce data and address sequences (like well-known march test sequences), check output signals of the memory and produce error reports and/or reconfiguration information to be used in self-repair mode.

To reduce circuitry overhead and testing time, one test processor may send test data to multiple memories in parallel. A processor implemented in accordance with the present invention generally satisfies the following conditions: 1) the sequence of test data is memory-invariant (e.g., the same data may be sent to memories of different sizes and configurations, even to memories generated by different compilers); 2) test data may go through a "narrow" channel in a packed form using an encoding scheme such that memories may be tested "at speed"; 3) decoding is generally simple (e.g., both fast and employing a moderate number of gates).

The present invention generally provides (both structurally and functionally) a new effective method of performing data manipulations in memory collars and in the built-in test controller. In one example, the present invention may be implemented as a data controlling subsystem. The present invention may allow individual memory circuits, or subsets of memory circuits, to be tested and/or operated using a common controller.

Figure 1:
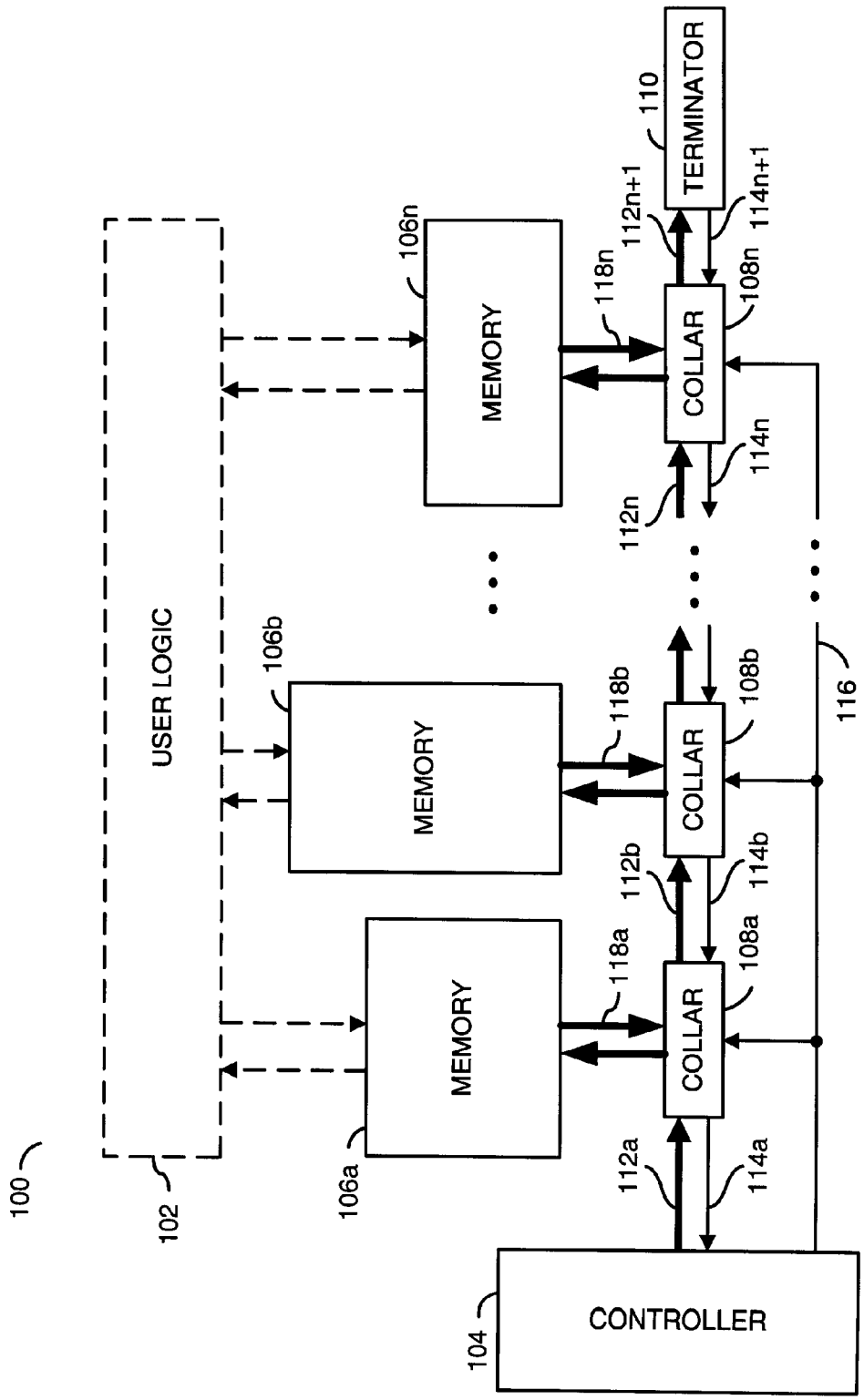
FIG. 1 is a block diagram illustrating a MBIST chain architecture in which the present invention may be implemented.

Referring to FIG. 1, a block diagram of a system 100 is shown in accordance with a preferred embodiment of the present invention. The system 100 generally comprises a block (or circuit) 102, a block (or circuit) 104, a number of blocks (or circuits) 106a-106n, a number of blocks (or circuits) 108a-108n and a block (or circuit) 110. In one example, the circuit 102 may be implemented as a user logic circuit. The circuit 104 may be implemented as a controller circuit. In one example, the controller circuit 104 may be implemented as a built-in self test (BIST) circuit. The circuits 106a-106n may be implemented as memory circuits. The controller circuit 104 may be a common controller used with each of the memory circuits 106a-106n. The circuits 108a-108n may be implemented as memory collar circuits. The circuit 110 may be implemented as a termination circuit.

The memory circuits 106a-106n may be on the same integrated circuit, or on separate integrated circuits from the collar circuits 108a-108n. For example, the memory circuits 108a-108n may be integrated on an integrated circuit along with the collar circuits 108a-108n. Alternatively, a socket or sockets (not shown) may be implemented between the memory circuits 106a-106n and the collar circuits 108a-108n. With a socket, different memory circuits 106a-106n may be connected to the collar circuits 108a-108n.

The system 100 may be implemented as part of a MBIST chain architecture. For example, the memory circuits 106a-106n may form a chain. A number of busses 112a-112n, a number of busses 114a-114n and a bus 116 may be implemented. The busses 112a-112n may be implemented having a moderate width (e.g., 8-10 bits). The busses 114a-114 and the bus 116 may be implemented as single-bit busses. However, other bit-widths may also be implemented. The busses 112a-112n and 114a-114n may connect the memory collars 108a-108n to form a pipelined chain. The controller 104 may be coupled on one end of the chain. The terminator unit 110 may be coupled on another end of the chain via busses 112n+1 and 114n+1. The busses 112n+1 and 114n+1 may be implemented similarly to the busses 112a-112n and 114a-114n, respectively.

Each of the collar circuits 108a-108n may be configured to operate with a particular one of the memory units 106a-106n. The collar circuits 108a-108n may be implemented to allow the various memory circuits 106a-106n to operate with the common controller 104. For example, the collar 108a may operate with the memory 106a, the collar 108b may operate with the memory 106b, etc. The structures and/or size of the memories 106a-106n may be varied to meet the design criteria of a particular implementation. For example, a customer may specify a 4-port memory having 1024 words×128 bits, plus a 1-port memory having 1M words×16 bits, plus a 2-port memory having 16K×36 bits with one port for reading and 1 port for writing, etc. The present invention may be used to custom generate collars 108a-108n and the controller 104 to test such memories. In general, the parameters of the memory circuits 106a-106n are known in advance. The length of particular busses 112a-112n and 114a-114n connecting the neighboring collars 108a-108n (or to the controller 104 and the nearest one of the collars 108a-108n) is not normally a critical parameter and may be varied. A MBIST chain architecture normally permits splitting long connections into smaller pieces by adding flip-flop boundaries between such connections.

The bus 116 may be implemented to send a set of 1-bit mode selection signals (e.g., TEST/USER MODE SELECTION) to each of the collars 108a-108n. For example, a first value (e.g., 0) may indicate a user mode and a second value (e.g., 1) may indicate a test mode. In the user mode, the memory collars 108a-108n may be "switched off" and the connections between the memories 106a-106n and the user logic 102 may be enabled. In the test mode, the connections between the memories 106a-106n and the user logic 102 may be disabled and the connections between the memories 106a-106n and the collars 108a-108n may be enabled. The memory collars 108a-108n may send read/write commands, addresses and data to the memories 106a-106n through a number of busses 118a-118n. The busses 118a-118n may be implemented, for example, as bi-directional busses, a set of uni-directional busses, or a combination of bi-directional and uni-directional busses. The memory collars 108a-108n may also receive values that may be output by or read from the memories 106a-106n through the busses 118a-118n.

The present invention may be implemented as part of a MBIST Chain architecture. The architecture may include the controller 104, collars 108a-108n and the busses connecting the collars into a pipelined chain with the controller 104 on one side and the terminator unit 110 on the other side. The busses may be, in one example, of moderate width (e.g., about 8-10 bits). Each of the collars 108a-108n may operate with a single respective memory unit 106a-106n. Structures and sizes of the memories 106a-106n may differ.

Figure 2:
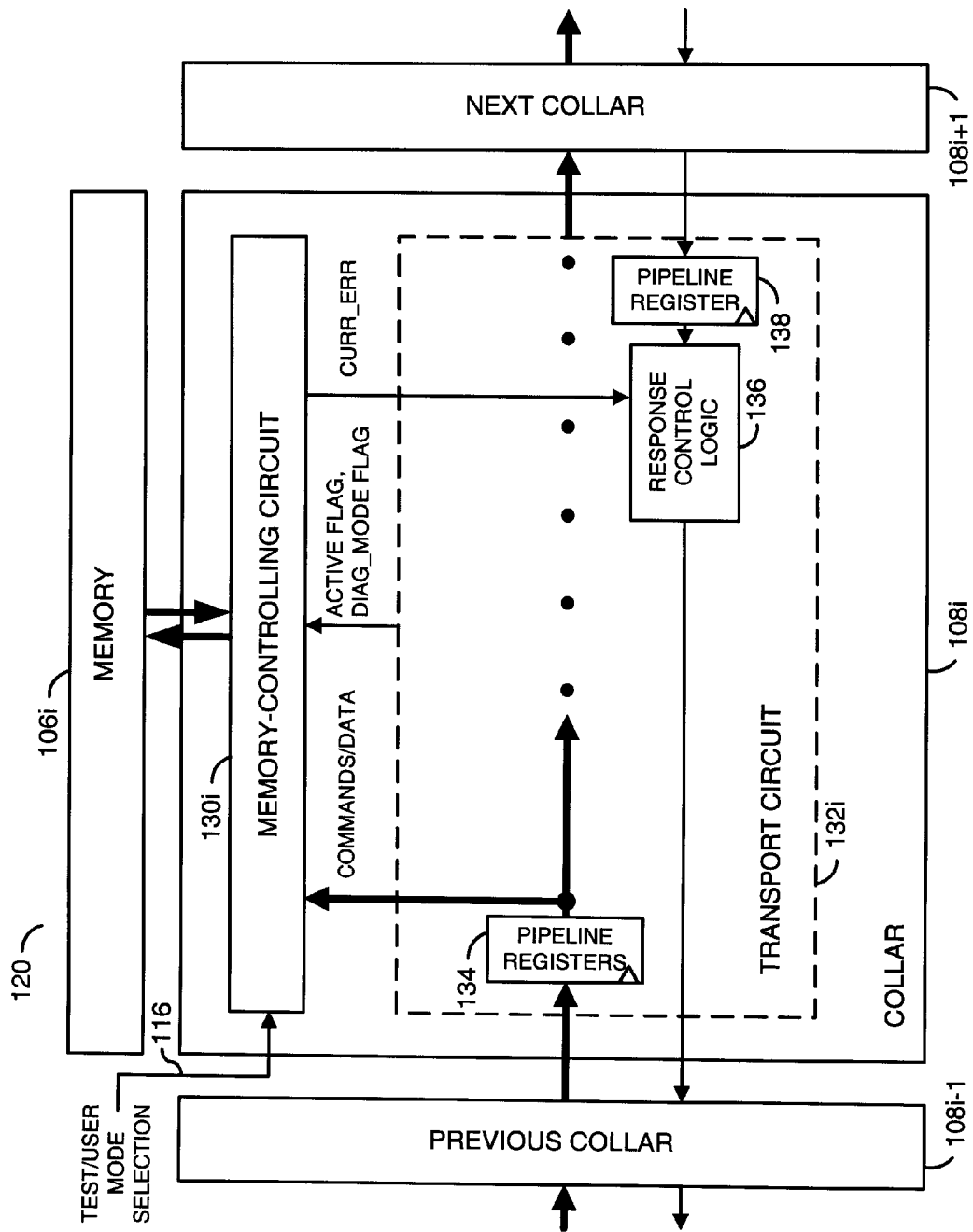
FIG. 2 is a block diagram illustrating a memory collar in accordance with an embodiment of the present invention.

Referring to FIG. 2, a detailed diagram is shown illustrating a subsystem 120. The subsystem 120 may be implemented as part of the MBIST chain architecture 100. The subsystem 120 generally illustrates a number of interconnection busses and/or components of an example collar 108i. The subsystem 120 generally performs functions including (i) transmitting commands from the controller 104 to an individual memory 106i and (ii) reading back data from the individual memory 106i to the controller 104.

The collar 108i may comprise, in one example, a block (or circuit) 130i and a block (or circuit) 132i. The circuit 130i and the circuit 132i may be relatively independently operating parts (or sub-modules). The circuit 130i may be implemented as a memory-controlling portion (MCP) of the collar 108i. The circuit 132i may be implemented as a transport portion (TP) of the collar 108i. The circuit 130i and the circuit 132i may be implemented as finite state machines (FSMs). For example, the circuit 130i and the circuit 132i may include a number of internal storage elements (e.g., flip-flops, register, etc.). Each of the collars 108a-108n may be implemented similarly to the collar 108i (e.g., with a respective memory-controlling circuit 130a-130n and a respective transport circuit 132a-132n).

The memory-controlling portion (MCP) 130i of each of the collars 108a-108n generally interprets the test commands, prepares input signals for the memory 106i during testing, checks the outputs from the memory 106i during testing and produces 1-bit output signals. The MCP 130i may comprise a combination of subunits. The present invention generally concerns subunits of the MCP 130i that are responsible for generating data sequences to be sent to the corresponding memory 106i (excluding addresses, the control of which is described separately in a co-pending patent application U.S. Ser. No. 12/183,562, filed concurrently, and which is incorporated herein by reference in its entirety) as well as for pre-processing the outputs of the corresponding memory 106i.

The transport portion (TP) 132i of each of the collars 108a-108n may be responsible for transmitting test commands along the chain, setting test status of the individual memories 106a-106n (e.g., do not test/test all outputs/test only one output bit, etc.) and collecting and returning the status (e.g., good/faulty) of the individual memories 106a-106n.

The memory-controlling circuit 130i may have an input/output that may interface with the memory 106i, a first input that may receive the signal TEST/USER MODE SELECTION, a second input that may receive commands and data, a third input that may receive one or more control signals (e.g., ACTIVE, DIAG_MODE, etc.) and an output that may present a signal (e.g., CURR_ERR). The control signals ACTIVE, DIAG_MODE, etc. may be implemented as flags. In one example, the interface between the block 130i and the memory 106i may be implemented as a bi-directional bus. In another example, the interface between the block 130i and the memory 106i may be implemented as separate input and output busses. However, other appropriate interfaces may be implemented between the block 130*i* and the memory 106*i* to meet the design criteria of a particular implementation.

The transport circuit 132*i* generally comprises a block (or circuit) 134, a block (or circuit) 136 and a block (or circuit) 138. The circuits 134 and 138 may be implemented, in one example, as registers. The circuit 136 may be implemented as a response control logic. The block 134 may be configured to latch commands and data (e.g., COMMANDS/DATA) received from a previous sub-module (e.g., a collar 108(*i*−1) or the controller 104) for presentation to the circuit 132*i* and a next collar 108(*i*+1). The block 136 may be configured to receive (i) the signal CURR_ERR from the block 132*i* and (ii) an output of the block 136. The block 136 may be further configured to present an output to the previous sub-module. The block 136 may be configured to generate the output in response to the signal CURR_ERR and the output of the block 136. The block 138 may be configured to latch a signal received from the next sub-module (e.g., a collar 108(*i*+1)). The block 132*i* may include further control logic (or circuitry), not shown, that may be configured to generate the number of control signals ACTIVE, DIAG_MODE, etc.

In one example, the collars 108*a*-108*n* may be controlled by sequences of commands transmitted through the pipeline. With the exception of some initial part of the sequence (e.g., when each of the collars 108*a*-108*n* may be individually set into one of three modes: "off", "active" and "active+diag"), the commands may be transmitted without modification. For example, each collar 108*a*-108*n* may receive and process absolutely identical (albeit shifted in time, due to pipelining) sequences of commands.

In one example, commands may be divided into two major groups. The commands of a first group may correspond to actual memory access operations. The commands of a second group may be used (i) to initialize various parameters, (ii) to switch between operation modes and/or (iii) to perform other sorts of similar auxiliary actions. The commands are preferably distinguished by the content of the commands. In general, the meaning of a command does not depend on a previous command. The approach of the present invention enables very simple command decoding to be implemented. For example, commands may contain "prefixes" to identify the command and "suffixes" containing parameters of the command. When a command has a prefix not recognized as identifying any existing command, the command is generally interpreted as a "null operation" (e.g., NOP). The approach of the present invention generally permits easy addition of possible protocol extensions to support new specifications, without changing already designed collars.

As mentioned above, the collars 108*a*-108*n* may have, in one example, three operating modes: "off", "active" and "active+diag". In the off mode, the corresponding memory may be completely turned off (e.g., even clock inputs may be disconnected), and no read/write operations performed. Also, the output of the memory-controlling portion 130*i* of the respective collar 108*a*-108*n* may be constantly 0 in the off mode.

In the active mode, the corresponding memory 106*i* may be accessed via at most two ports: a so-called active port designated preferably for writing, and a passive port for reading. All output bits of the passive port may be compared with some expected (or predicted) values (e.g., transmitted along the above-mentioned pipeline in a packed form). In one example, the output value of the memory-controlling portion 130*i* may be set, for example, to 1 in the case of any mismatch. In another example, the comparison may be disabled explicitly, by the same pipeline command, or when the collar 108*i* recognizes that the current memory output is not meaningful. For example, the comparison may be disabled as a result of reading a nonexisting port or an out-of-address location.

The third operating mode may be referred to as a diagnostic (or "active+diag") mode, because both of the signals ACTIVE and DIAG_MODE produced by the transport portion 132*i* of the respective collar 108*i* are asserted (e.g., a logic high or 1). In the diagnostic mode, only one bit of the passive port is observed at a time (and compared with predicted values). The selection of the observed bit may be controlled by a specially designated bit selection register (described below in connection with FIG. 3).

In one example, the diagnostic mode may be used as follows: when a "regular" test indicates errors in one of memories 106*a*-106*n*, the erroneous memory may be activated, put in the diagnostic mode and each output bit re-tested separately. The sequence of output values (returned back via the pipeline) generally shows all positions of malfunctioning. In another example, the diagnostic mode may be used to observe the outputs of a memory as follows: put the memory in the diagnostic mode and make comparisons with the sequence of all 0s (described in more detail in connection with FIG. 6 below).

Figure 3:
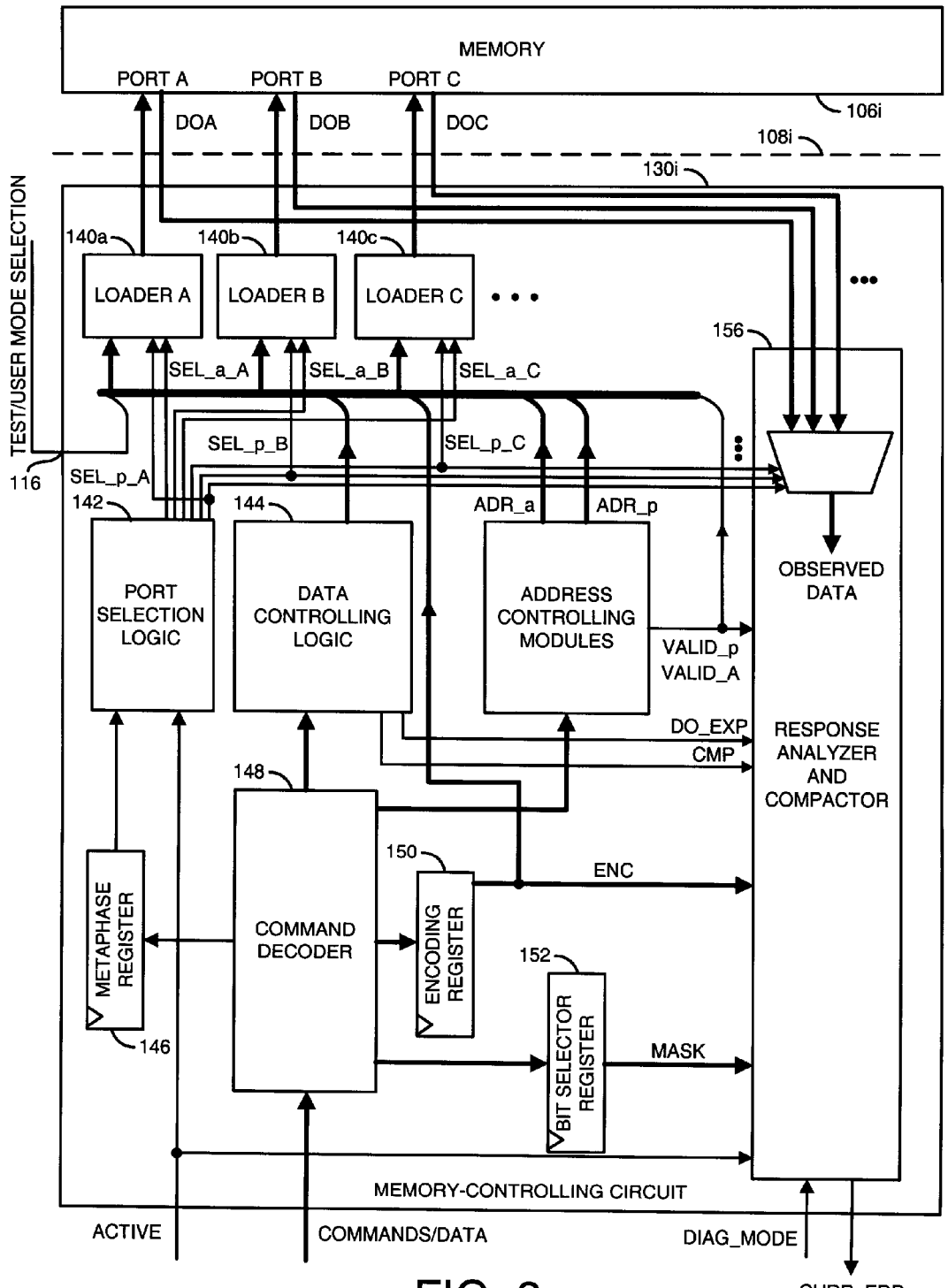
FIG. 3 is a block diagram illustrating a memory-controlling portion of the memory collar of FIG. 2 in accordance with an embodiment of the present invention.

Referring to FIG. 3, a detailed diagram is shown illustrating an example memory-controlling portion 130*i* implemented in accordance with a preferred embodiment of the present invention. In one example, the memory-controlling portion 130*i* may comprise a number of blocks (or circuits) 140*a*-140*n*, a block (or circuit) 142, a block (or circuit) 144, a block (or circuit) 146, a block (or circuit) 148, a block (or circuit) 150, a block (or circuit) 152, a block (or circuit) 154 and a block (or circuit) 156. The blocks 140*a*-140*n* may be implemented as loaders. In general, a loader 140*x* may be implemented for each port x of the corresponding memory 106*i*. The block 142 may be implemented as port selection logic. The block 144 may be implemented as data controlling logic. The block 146 may be implemented as a metaphase register. The block 148 may be implemented as a command decoder. The block 150 may be implemented as an encoding register. The block 152 may be implemented as a bit selector register. The block 154 may be implemented as one or more address controlling modules. The block 156 may be implemented as a response analyzer and compactor.

Each of the blocks 140*a*-140*n* may have (i) an output that may present one or more signals to a respective input of the memory 106*i*, (ii) a first input bus that may receive data, control and address signals from the blocks 144 and 154, (iii) a second input that may receive the signal TEST/USER MODE SELECTION, (iv) a third input that may receive a signal (e.g., ENC) indicating a data encoding in use, (V) a fourth input that may receive a respective signal (e.g., SEL_a) indicating an active mode, and (vi) a fifth input that may receive a respective signal (e.g., SEL_p) indicating a passive mode. Each of the blocks 140*a*-140*n* may also have a number of inputs that may receive signals from the user logic 102 (illustrated in FIG. 4 below).

The block 142 may have (i) a number of first outputs that may present the respective signals SEL_a to each of the blocks 140*a*-140*n*, (ii) a number of second outputs that may present the respective signals SEL_p to each of the blocks 140*a*-140*n* and the block 156, (iii) a first input that may receive a signal from the block 146 and (iv) a second input that may receive the signal ACTIVE. The block 144 may have (i) an output bus that may present data and related control signals to each of the blocks 140*a*-140*n*, (ii) a second output that may present a signal (e.g., DO_EXP) to an input of the block 156, (iii) a third output that may present a signal (e.g., CMP) to an input of the block 156 and (iv) a first input that may receive one or more signals from a first output of the block 148. The signal DO_EXP may comprise packed expected data output values (or hints) that may be used by the block 156 in testing the memory 106i.

The block 146 may have an input that may receive one or more signals from a second output of the block 148. The block 148 may also have a first input that may receive commands and data (e.g., the signal COMMANDS/DATA) from the block 132, a third output that may present one or more signals to an input of the block 150, a fourth output that may present one or more signals to an input of the block 152, and a fifth output that may present one or more signals to an input of the block 154. The block 150 may have an output that may present the signal ENC to a respective input of each of the blocks 140a-140n and an input of the block 156. The signal ENC may be configured to indicate data encoding is in use. The block 154 may have an output that may present one or more signals (e.g., MASK) to an input of the block 156. The signal MASK may be configured to control which bits received from the memory 106i are analyzed (or observed).

The block 154 may have a first output that may present a signal (e.g., ADR_a), a second output that may present a signal (e.g., ADR_p) and a third output that may present a pair of signals (e.g., VALID_a and VALID_p). The signals ADR_a and ADR_p may be implemented as active and passive address signals, respectively. The signals VALID_a and VALID_p may be implemented as corresponding active address and passive address validity signals. The block 156 may have a number of inputs that may receive responses (or observed data) from respective outputs of the memory 106i, an input that may receive the signal ACTIVE, an input that may receive the signal DIAG_MODE and an output that may present the signal CURR_ERR. The block 156 may be configured to generate the signal CURR_ERR in response to (i) the signals received from the memory 106i, (ii) the signals received from the blocks 142, 144, 150, 152, and 154, (iii) the signal ACTIVE and (iv) the signal DIAG_MODE.

The MBIST chain architecture 100 implemented in accordance with the present invention may provide for parallel testing of memories of various types. For example, the present invention may be used with one-port memories (e.g., 111-), two-port memories with one read-only and one write-only ports (e.g., 211-), two-port memories where both ports can read and write (e.g., 222-) and four-port memories with two read-only and two write-only ports (e.g., 422-). In one example, memory ports may be named A to D, and write-only ports (if any) may precede read-only ports (if any) alphabetically (e.g., a 211-memory we may have input port A and output port B, whereas a 422-memory may have input ports A and B, and output ports C and D). To test the various memories (as well as hypothetical 444-memories) via all possible port pair combinations, the same sequence of I/O memory access operations may be repeated as illustrated in the following TABLE 1:

TABLE 1

| METAPHASE ID | MEMORY TYPE | | | | |
|---|---|---|---|---|---|
| | 111 | 211 | 222 | 422 | 444 |
| 0 0 | A→A | — | A→A | — | A→A |
| 0 1 | — | A→B | A→B | — | A→B |
| 1 0 | — | — | B→A | — | B→A |
| 1 1 | — | — | B→B | — | B→B |
| 0 2 | — | — | — | A→C | A→C |
| 0 3 | — | — | — | A→D | A→D |
| 1 2 | — | — | — | B→C | B→C |

TABLE 1-continued

| METAPHASE ID | MEMORY TYPE | | | | |
|---|---|---|---|---|---|
| | 111 | 211 | 222 | 422 | 444 |
| 1 3 | — | — | — | B→D | B→D |
| 2 0 | — | — | — | — | C→A |
| 2 1 | — | — | — | — | C→B |
| 3 0 | — | — | — | — | D→A |
| 3 1 | — | — | — | — | D→B |
| 2 2 | — | — | — | — | C→C |
| 2 3 | — | — | — | — | C→D |
| 3 2 | — | — | — | — | D→C |
| 3 3 | — | — | — | — | D→D | where P→Q represents memory access via input (active) port P and output (passive) port Q.

To simplify prediction of output values (and, therefore, complexity of processes and netlists), each metaphase starts in the same conditions. There are multiple ways to have each metaphase start in the same conditions. In one example, each metaphase may be considered as starting from non-initialized memory (e.g., values initially stored in the memory are considered as unknown and unpredictable). In another example, all metaphases may be considered as starting when memory is in the same predetermined state (e.g., all locations contain some deterministic values). In the latter case, the metaphases may be left in the same memory state, and an initializing I/O sequence may be run before the very first metaphase starts.

In both cases, output values depend only on one 1-bit parameter: are input and output ports equally chosen or not? Actual ports are not important. Thus, unused cells in the TABLE 1 above may be allocated to repeat some parts of the tests. Repeating some parts of the tests may improve fault detection (e.g., for non-deterministic faults), but at a cost of extra power consumption. One possible extended testing scheme may be summarized as in the following TABLE 2:

TABLE 2

| METAPHASE ID | MEMORY TYPE | | | | |
|---|---|---|---|---|---|
| | 111 | 211 | 222 | 422 | 444 |
| 0 0 | A→A | — | A→A | — | A→A |
| 0 1 | — | A→B | A→B | A→C | A→B |
| 1 0 | — | A→B | B→A | A→D | B→A |
| 1 1 | A→A | — | B→B | — | B→B |
| 0 2 | — | A→B | A→B | A→C | A→C |
| 0 3 | — | A→B | B→A | A→D | A→D |
| 1 2 | — | A→B | A→B | B→C | B→C |
| 1 3 | — | A→B | B→A | B→D | B→D |
| 2 0 | — | A→B | A→B | A→C | C→A |
| 2 1 | — | A→B | B→A | A→D | C→B |
| 3 0 | — | A→B | A→B | B→C | D→A |
| 3 1 | — | A→B | B→A | B→D | D→B |
| 2 2 | A→A | — | A→A | — | C→C |
| 2 3 | — | A→B | A→B | B→C | D→D |
| 3 2 | — | A→B | B→A | B→D | D→C |
| 3 3 | A→A | — | B→B | — | D→D |

The sequence of 16 metaphases may be truncated when there are no "complex" memories. For example, when 444-memories are not used, running the first 8 metaphases may be enough. When only 1-port and 2-port memories are implemented, the test may be further reduced, for example, to 4 metaphases. And so on.

On the netlist level, a metaphase-supporting engine may be formed comprising a part of the command decoder 148, the metaphase register 146 and the port selection logic 142. The command decoder 148 may be configured, in one example, to detect a metaphase setting command (e.g., "set metaphase= . . . ") with a 4-bit parameter. The metaphase register 146 may be configured to store the 4-bit parameter. The port selection logic 142 may act as a decoder for the metaphase-supporting engine.

For n-port memories, the metaphase-supporting engine may have, for example, 2n outputs: n selector flags for active ports (e.g., $a_A$=SEL_a_A, $a_B$=SEL_a_B, etc.) and n selector flags for passive ports (e.g., $p_A$=SEL_p_A, $p_B$=SEL_p_B, etc.). When the transport portion 132$i$ of the respective collar 108$i$ sets the signal ACTIVE to a logic low or 0, the outputs of the port selection logic 142 are also 0 (e.g., disabling all memory access to reduce power). When the signal ACTIVE is set to a logic high or 1, not more than one active port and not more than one passive port may be selected (depending on the particular memory configuration and the current metaphase), in a way similar to TABLES 1 and 2 above. Logical functions describing port selection may be quite simple.

In one example, the metaphase id may be implemented as a pair of 2-bit numbers (e.g., a 4-bit vector (p,q; r,s)) and the state of the signal ACTIVE may be represented as f. Then using TABLE 1, selector flags for active and passive ports (e.g., $a_A, a_B, a_C, \ldots; p_A, p_B, p_C, \ldots$) for 111-, 211-, 222-, 422- and 444-memories may be determined as follows:

111: $a_A$=$p_A$=$\bar{p}\ \bar{q}\ \bar{r}\ \bar{s}$ f;
211: $a_A$=$p_B$=$\bar{p}\ \bar{q}\ r\ s$ f, $a_B$=$p_A$=0;
222: $a_A$=$\bar{p}\ \bar{q}\ r$ f, $a_B$=$\bar{p}\ q\ \bar{r}$ f, $p_A$=$\bar{p}\ r\ s$ f, $p_B$=$\bar{p}\ r\ s$ f;
422: $a_A$=$\bar{p}\ \bar{q}\ r$ f, $a_B$=$\bar{p}\ q\ r$ f, $p_C$=$\bar{p}\ r\ \bar{s}$ f, $p_D$=$\bar{p}\ r\ s$ f, $a_C$=$a_D$=$p_A$=$p_B$=0;
444: $a_A$=$\bar{p}\ \bar{q}$ f, $a_B$=$\bar{p}\ q$ f, $a_C$=$p\ \bar{q}$ f, $a_D$=$p\ q$ f, $p_A$=$\bar{r}\ \bar{s}$ f, $p_B$=$\bar{r}\ s$ f, $p_C$=$r\ \bar{s}$ f, $p_D$=$r\ s$ f.

TABLE 2 defines a more complicated (but still simple) mapping. For example, starting with intermediate signals z= $\overline{p\oplus r}$ & $\overline{q\oplus s}$ (e.g., z equals 1 if and only if selections of active and passive ports are identical) and t=$p\oplus r\oplus s$, the rest of the selecting process may be described as follows:

111: $a_A$=$p_A$=z f;
211: $a_A$=$p_B$=$\bar{z}$ f, $a_B$=$p_A$=0;
222: $a_A$=(t$\oplus$z) f, $a_B$=$\overline{(t\oplus z)}$ f, $p_A$=$\bar{t}$ f, $p_B$=t f;
422: $a_A$=$\overline{m(p,q,r)}$ z f, $a_B$=m(p,q,r) z f, $p_C$=$\bar{t}\ \bar{z}$ f, $p_D$=t $\bar{z}$ f, $a_C$=$a_D$=$p_A$=$p_B$=0, where m( . . . ) is the 3-input majority function;
444: unchanged.

Metaphases allow the addition of some extra tests that are specific for particular memories only. For example, longer metaphase ids may be implemented and the extra tests allocated to the "extended" metaphases.

The memory access operations during each metaphase may be logically grouped into phases. The term phase as used herein has the same meaning as in standard march-like processes: a sequence of memory access operations where each location is systematically (in one of many possible orders) visited and identical (or almost identical) writings and readings performed at the location, and maybe in the nearest neighborhood of the location. In one example, a sample phase may look like "visit each location and write a 0." In this example, no assumptions are made about the initial content of the memory. In another example, a sample phase may comprise: "visit each location; read from the location expecting a value of 0; write a new value of 1."

When memory locations may hold only two values (e.g., 0 and 1), the data to be written in a location, or expected after reading data from a location may be transmitted without any encoding. However, memories are generally operating with multi-bit words that may not fit into a narrow pipeline without significant speed loss. To overcome this kind of problem, data encoding may be implemented. When during testing only a few different data words are sent into the memory and read back, short codes may be assigned to the data words and the codes transmitted instead of the full data words. In one example, operation may be performed with two words (e.g., 00 . . . 00 and 11 . . . 11). The two words may be replaced by 1-bit codes. In more complex cases, like frequently used words of a form like 00 . . . 0011 . . . 11 or 0101 . . . 0101, longer codes may be implemented.

To further reduce the size of the codes, encoding may be varied during testing. For example, different encodings may be used for different parts of the test. In one example, the encoding register 150 may contain the definition of the current encoding scheme. The encoding register 150 may be modified by a special pipeline command. Very short (e.g., even 1-bit long; actual size depends on implementation) codewords may be expanded into full-size data words by a special functional unit called a data expander. For example, the data expander may be implemented with two input busses. A first bus (e.g., ENC) may carry a definition of the current encoding system. A second bus (e.g., PD) may carry packed data. An output bus (e.g., ED) may be implemented for communicating the expanded data. A bit-width of the output bus ED is not necessarily the same in all of the collars 108$a$-108$n$. Rather, the bit-width of each respective bus ED should match the bit-width of corresponding memories 106$a$-106$n$. The mapping ED f(ENC, PD) may be chosen in different ways. In one example, the mapping may be implemented by bit repeating. For example, a 1-bit signal PD=a may be expanded into an n-bit ED as aa . . . aa. A more realistic system may support 4 data words (e.g., 00 . . . 00, 11 . . . 11, 00 . . . 0011 . . . 11 and 11 . . . 1100 . . . 00) and 1-bit codes. For example, the encoding register 150 may hold 4 bits (e.g., p, q, r, and s), and the data expander may produce pp . . . ppqq . . . qq for PD=0 and rr . . . rrss . . . ss for PD=1.

Each of the collars 108$a$-108$n$ may contain multiple data expanders (e.g., one for each input port of the memory under test and one more for the response analyzer and compactor block 156 (described below in connection with FIGS. 4-6). Encoding may also be made address-dependent. For example, words like 0→00 . . . 00 and 1→x$\bar{x}$x$\bar{x}$ . . . x$\bar{x}$x$\bar{x}$ may be implemented, where x equals, for example, the least significant bit of the address. However, implementation of address-dependent encoding may involve some extra connections not illustrated in FIGS. 4-6.

In one example, a command describing all inputs for both active and passive ports as well as expected outputs of the passive port may be implemented as an elementary particle of a test scheme in accordance with the present invention. Data encoding and address encoding may reduce the commands to fixed-width records with short (1- or 2-bit) fields. In one example, the fixed-width records may be implemented as follows: EN_a (active port enable: on/off), EN_p (passive port enable), WE_a (write enable on active port: on/off), WE_p (write enable on passive port: on/off), PI_a (packed input data on active port), PI_p (packed input data on passive port), AED_a (address editing on active port: use current address or so-called dual address), AED_p (address editing on passive port), AM (address modification after the current command: same/next/previous), DO_EXP (packed expected output data-on passive port only), CMP (output comparison on/off).

The records may also be compacted into shorter bit-vectors to fit into the width of the pipeline implemented. For example, not all combinations of values of the fields may be used in reality. For example, WE_p=1 or CMP=1 may rarely appear in combination with EN_p=0. Compaction may be possible up to [log$_2$ (number of different commands)]+1 bits, where one extra bit is implemented to enable easy distinction between this sort of command and other pipeline commands like various register resetting and transport system operations. An address-related part of commands may be processed in the address controlling modules 154. The data-related part may be detected in the command decoder 148 and expanded into the above-mentioned fields by the data controlling logic 144.

Figure 4:
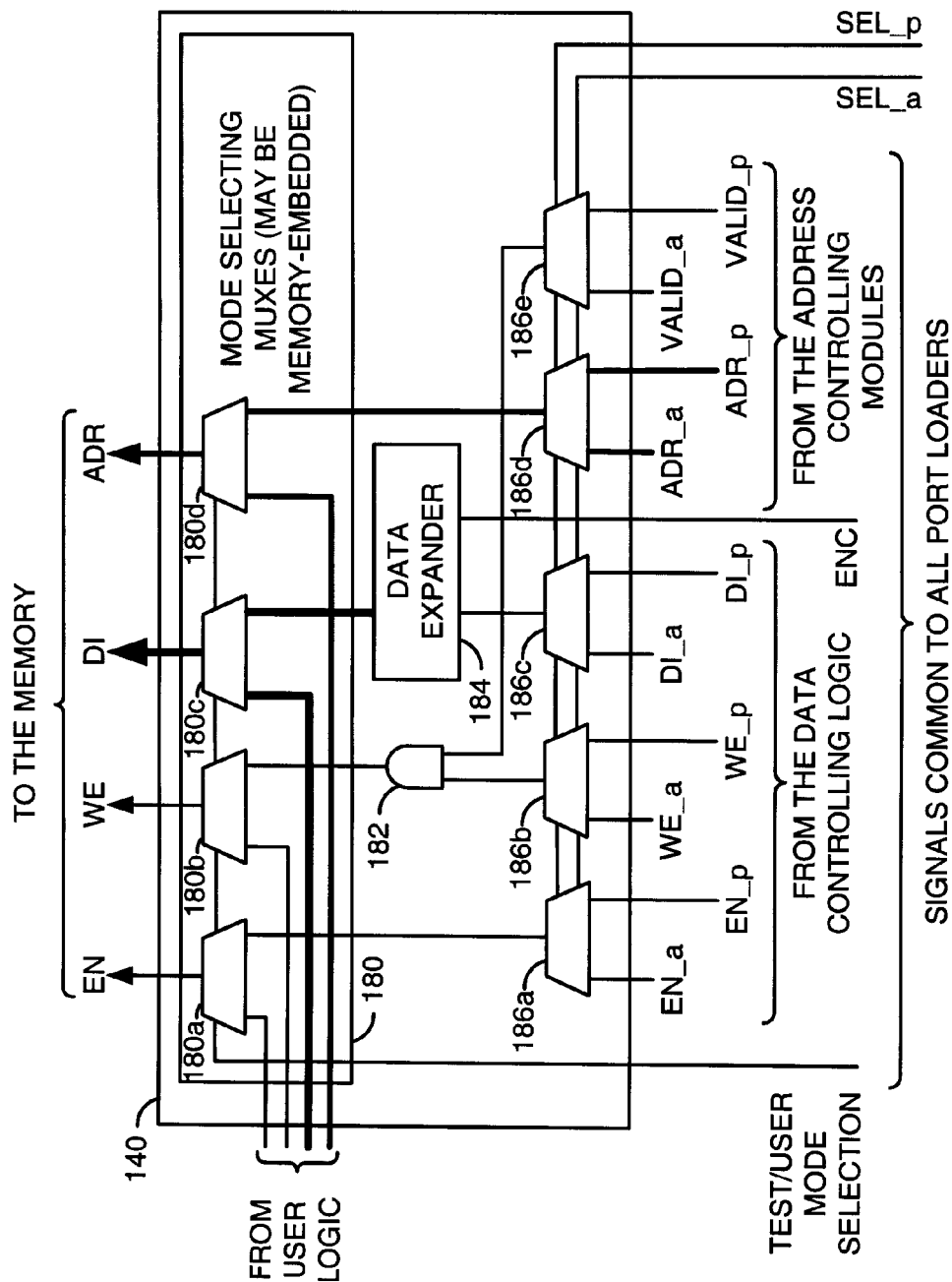
FIG. 4 is a block diagram illustrating an example port loader.

Referring to FIG. 4, a detailed diagram is shown illustrating an example loader circuit 140*i* implemented in accordance with a preferred embodiment of the present invention. In one example, the loader 140*i* may comprise a block (or circuit) 180, a block (or circuit) 182, a block (or circuit) 184, and a number of blocks (or circuits) 186*a*-186*e*. In one example, the block 180 may be implemented as a number of blocks 180*a*-180*d*. The blocks 180*a*-180*d* and 186*a*-186*e* may be implemented, in one example, as multiplexer circuits. The block 182 may be implemented, in one example, as a two-input AND gate. The block 184 may be implemented, in one example, as a data expander.

Each of the blocks 180*a*-180*d* may have a control input that may receive the signal TEST/USER MODE SELECTION and a first data input that may receive a respective signal or signals from the user logic 102. The block 180*a* may have a second data input that may receive a signal from an output of the block 186*a*. The block 180*b* may have a second data input that may receive a signal from an output of the block 182. The block 180*c* may have a second data input that may receive a signal from an output of the block 184. The block 180*d* may have a second data input that may receive a signal from an output of the block 186*d*. The block 182 may have a first input that may receive a signal from an output of the block 186*b* and a second input that may receive a signal from an output of the block 186*e*. The block 182 may be configured to generate the signal presented to the second data input of the block 180*b* as a logical combination of the signals received from the blocks 186*b* and 186*e*.

The block 184 may have a first input that may receive a signal from an output of the block 186*c* and a second input that may receive the signal ENC. the block 184 may be configured to generate the signal presented to the second data input of the block 180*c* in response to the signals received from the block 186*c* and the signal ENC. The blocks 186*a*-186*e* may have a first control input that may receive the signal A, a second control input that may receive the signal P, a first data input that may receive a respective signal (e.g., EN_a, WE_a, DI_a, ADR_a, VALID_a, respectively) associated with an active mode and a second data input that may receive a respective signal (e.g., EN_p, WE_p, DI_p, ADR_P, VALID_P, respectively) associated with a passive mode.

The block 140 generally comprises a subunit providing actual inputs to one of the ports of the memory 106*i*. The block 140 may be directly connected to the memory 106*i*. The block 140 may be designed differently depending not only on memory type and size, but also on the properties of the individual ports (e.g., input, output or I/O). FIG. 4 generally illustrates an example internal structure of a Loader that may be used with basic memories (e.g., memories with no built-in testing components). In one example, the memory may have ports controlled by a number of signals (e.g., EN, WE, DI and ADR). The signal EN may be implemented as an enable signal. For example, when the signal EN is a logic low or 0, the whole port may be turned off disabling all read/write operations. The signal WE may be implemented as a write enable signal. In one example, the signal WE may comprise a 1-bit signal. The signal DI may be implemented as a data in signal. In one example, the signal DI may comprise an n-bit bus. The signal ADR may be implemented as an address signal. In one example, a bus of appropriate width may be implemented. More complicated memories may implement additional inputs and outputs. One example of an extension is a so-called shadow writing feature. Ports of a memory may have an extra pin such that a high (1) value on the pin disables actual writing operation, but copies (with appropriate delay) the input word to the output.

In one example, the block 140 may have two operation modes: a user mode and a test mode. In the user mode, all the inputs may be connected to the user logic 102. In the test mode, all the inputs may be driven by signals generated in the respective collar 108*i*. To reduce power consumption, switching in any part of the memory collars 108*a*-108*n* may be blocked (e.g., disabling clocks of all related flip-flops) when in the user mode. Some memories may have built-in switching between the user and test modes. For example, the multiplexers 180*a*-180*d* may be implemented in the memories rather than in the block 140.

A majority of the inputs may be common for all port loaders 140 of the architecture 100. The only exceptions may be inputs SEL_a and SEL_p. A high (or logic 1) value of the signals SEL_a and SEL_p generally indicates that the respective port is currently in use as an active port or a passive port, respectively.

The functionality of the block 140 in the testing mode may be very simple. In one example, the block 140 may make plain selection between values prepared for active and passive ports. When a port is selected both as active and passive, either values may be chosen. However the same addresses and data should be used for both ports, to avoid any problems. When a port is neither active nor passive, the respective signal EN is set to 0 and other inputs are irrelevant. There are some natural deviations from this straightforward descriptions. For example:

(i) the data input (DI) port of the memory may be driven by the expanded data using the above-described data expander module;

(ii) the block 140 may block writes to invalid addresses by masking (ANDing) the write enable (WE) signals with the respective address validity (VALID) signals.

There may also be modifications due to variations of memories under test. For example:

(i) the block 140 for a read-only port may have no WE and DI outputs and related parts of the circuit; the block 140 also may have a simpler structure of active/passive selection multiplexers, because such a port cannot be chosen as active;

(ii) a write-only port cannot be chosen as passive, which also allows the structure of active/passive selection multiplexers to be simplified;

(iii) in the case of a 1-port memory, active/passive selection multiplexers may be omitted (SEL_a=SEL_P without exceptions, so it is enough to drive the signal EN by EN_a & SEL_a, and the signal WE-by WE_a & VALID_a & SEL_a;

(iv) some memories have multi-bit write enable signals; in this case, the 1-bit WE may be repeated as many times as necessary;

(v) designing collars for testing memories with extra pins, like above-mentioned shadow write inputs, may involve the addition of appropriate additional multiplexers and other components both in the block 140 and in the data controlling logic 144.

Figure 5:
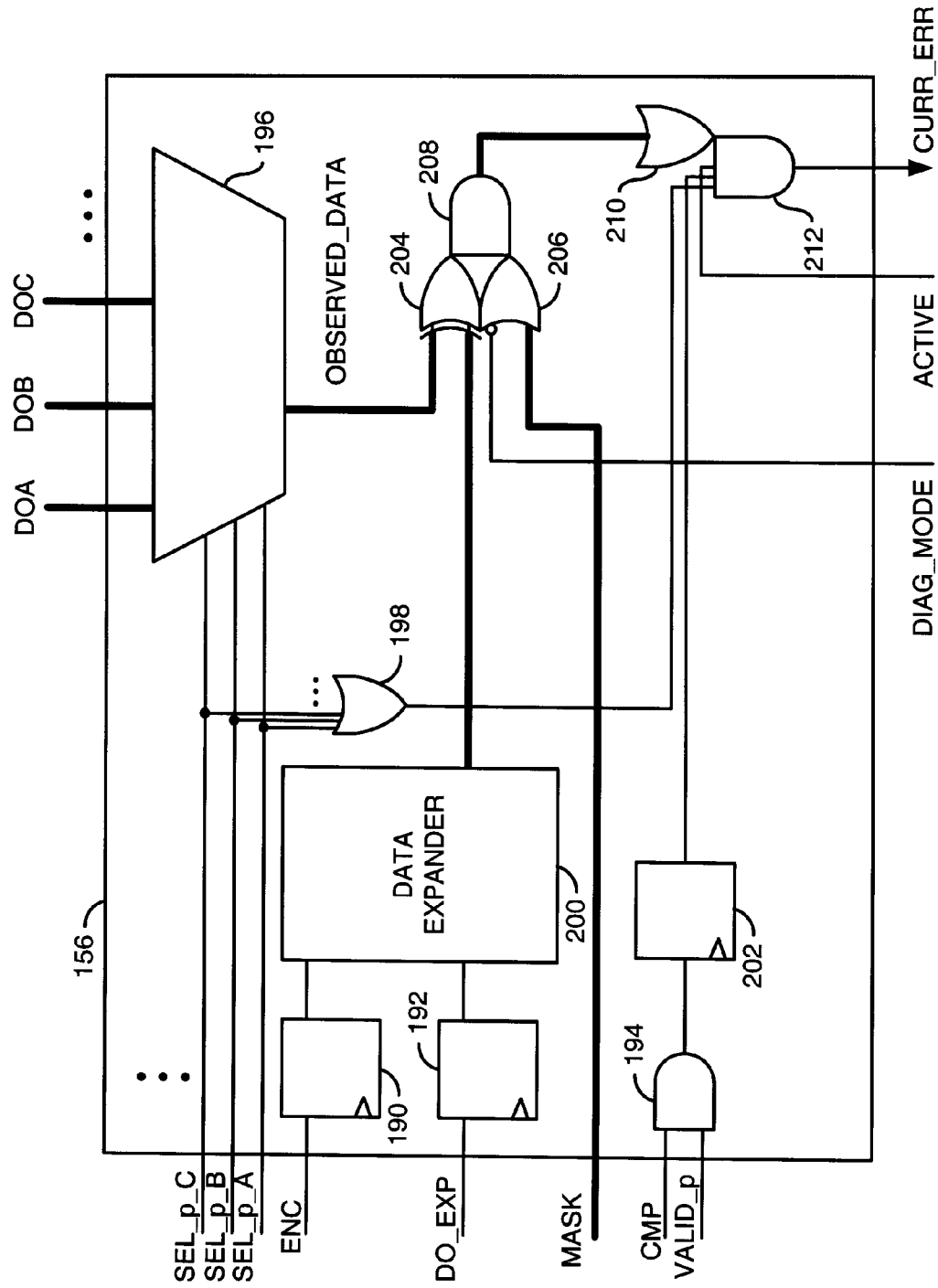
FIG. 5 is a block diagram illustrating an example response analyzer and compactor.

Referring to FIG. 5, a detailed diagram is shown illustrating an example response analyzer and compactor circuit 156 in accordance with a preferred embodiment of the present invention. In one example, the block 156 may comprise a block (or circuit) 190, a block (or circuit) 192, a block (or circuit) 194, a block (or circuit) 196, a block (or circuit) 198, a block (or circuit) 200, a block (or circuit) 202, a block (or circuit) 204, a block (or circuit) 206, a block (or circuit) 208, a block (or circuit) 210, and a block (or circuit) 212. The blocks 190, 192 and 202 may be implemented as storage elements (e.g., flip-flops, latches, registers, etc.). The block 194 may be implemented in one example, as a two-input AND-gate. The block 196 may be implemented, in one example, as a multiplexer circuit. The block 204 may be implemented in one example, as an EXCLUSIVE_OR logic block. The block 206 may be implemented in one example, as an OR logic block having a non-inverting (or active high) input and an inverting (or active low) input. The block 208 may be implemented in one example, as an AND logic block. The block 210 may be implemented in one example, as an OR logic block. The block 212 may be implemented in one example, as a four-input AND-gate.

The block 190 may have an input that may receive the signal ENC and an output that may be coupled to a first input of the block 200. The block 192 may have an input that may receive the signal DO_EXP and an output that may be coupled to a second input of the block 200. The blocks 190 and 192 may be configured to latch the signals ENC and DO_EXP for use by the block 200. The block 194 may receive the signal CMP at a first input and the signal VALID_p at a second input. An output of the block 194 may be presented to an input of the block 202.

The block 196 may have a number of control inputs that may receive the signals SEL_p_A, . . . , SEL_p_N, respectively, and a number of data inputs that may receive the signals DO_A, . . . , DO_N, respectively, where N represents the number of ports implemented in the associated memory 106*i*. The block 196 may be configured to select the signal at one of the signals DO_A, . . . , DO_N for presentation as the signal OBSERVED_DATA at an output of the block 196. The signals SEL_p_A, . . . , SEL_p_N may be presented to inputs of the block 198. The block 198 may be configured to assert an output in response to any of the signals SEL_p_A, . . . , SEL_p_N being asserted. The output of the block 198 may be presented to a first input of the block 212.

The signal OBSERVED_DATA may be presented to a first input of the block 204. The block 204 may have a second input that may receive an output the block 200. An output of the block 204 may be presented to a first input of the block 208. The block 206 may have a first input that may receive the signal MASK and a second input that may receive the signal DIAG_MODE. In one example, the second input of the block 206 may be active low. However, an active high input and an inverter may also be implemented. An output of the block 206 may be presented to a second input of the block 208. An output of the block 208 may be present to an input of the block 210.

The block 210 may have an output that may be presented to a second input of the block 212. The block 212 also may have (i) a third input that may receive a signal from an output of the block 202 and (ii) a fourth input that may receive the signal ACTIVE. An output of the block 212 may present the signal CURR_ERR.

The block 156 generally maps signals observed on the output of a passive port into a 1-bit value. The block 156 generally performs the following actions:

(i) selecting (e.g., using multiplexers) one output port of the memory as the passive port;

(ii) preparing expanded value for the comparison (using current data encoding (ENC) and packed expected data out value (DO EXP));

(iii) comparing the two bit vectors by bitwise XORing them;

(iv) if DIAG_MODE=1, masking the result with the given MASK;

(v) ORing all of the resulting bits; value 1 of the 1-bit result of this operation indicates that there was at least one distinction between actual and predicted outputs;

(vi) masking out the value in the cases of "false alarms", for example:

when the current collar is not active (ACTIVE=0);
when no port was selected as passive (e.g., when the current metaphase cannot be applied to the memory);
when comparison was explicitly disabled (e.g., CMP=0 on the previous clock cycle);
when the address was invalid (e.g., VALID_p=0 on the previous clock cycle).

In general, the output of the memory may be produced with some delay, the same delay may be artificially introduced for both the signal ENC and the signal DO_EXP by adding flip-flops. In one example, the flip-flops may be placed after the data expander 200. However, placing the flip-flops after the data expander generally results in a much larger number of flip-flops.

Figure 6:
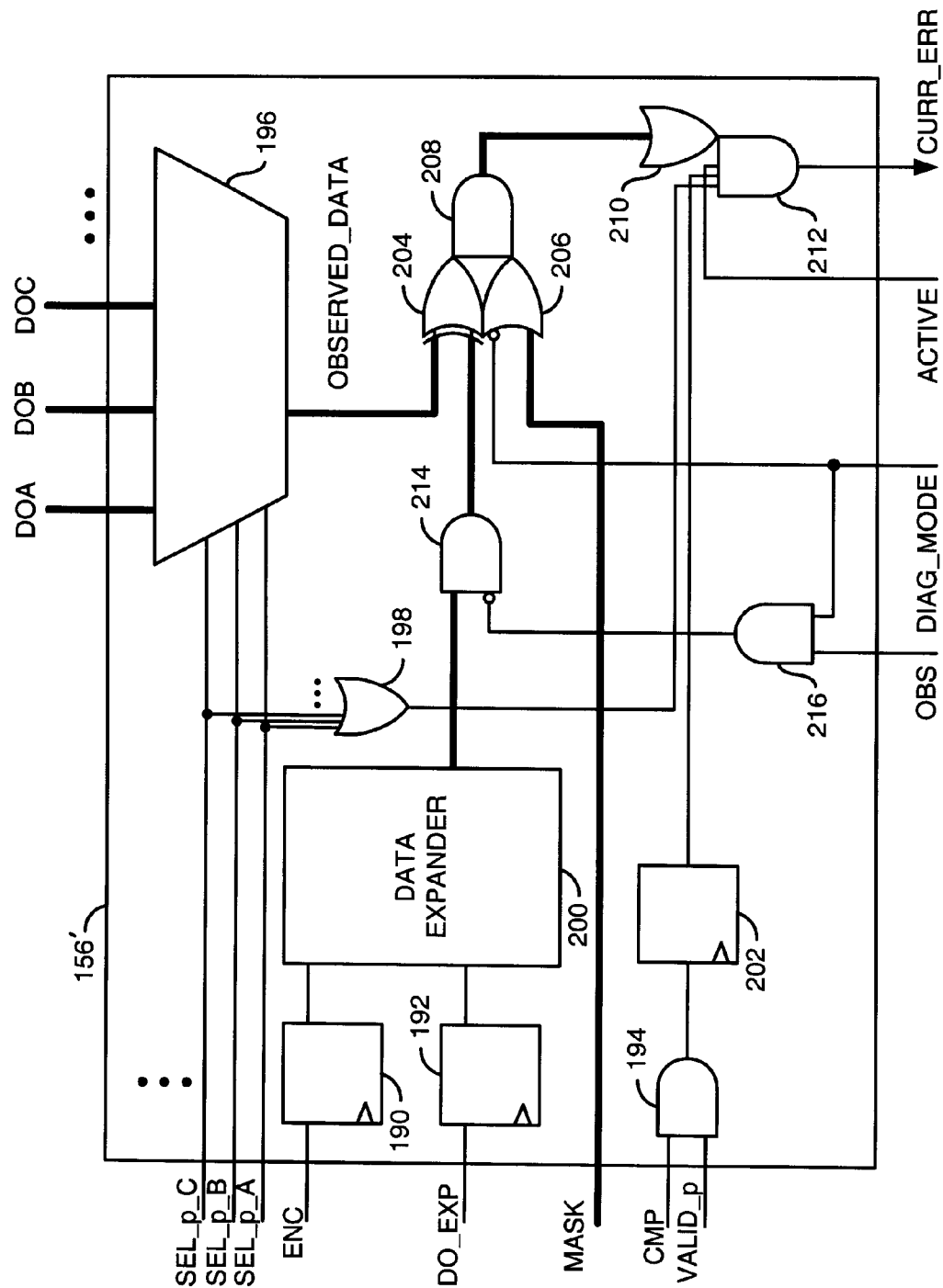
FIG. 6 is a block diagram illustrating another example response analyzer and compactor.

Referring to FIG. 6, a detailed diagram is shown illustrating an example response analyzer and compactor circuit 156' in accordance with another preferred embodiment of the present invention. The response analyzer and compactor circuit 156' may be implemented similarly to the response analyzer and compactor circuit 156, except that the response analyzer and compactor circuit 156' may further comprise a block 214 and a block 216. The block 214 may be implemented, in one example, as a logic block configured to OR the outputs of the data expander block 200 with a logical complement of an output of the block 216 and present the result to the second input of the block 204. The block 216 may be implemented, in one example, as an AND-gate. The block 216 may have a first input that may receive the signal DIAG_MODE and a second input that may receive a signal (e.g., OBS).

As a variant of the diagnostic mode, an optional observation mode may be implemented. In the observation mode, the output bit chosen by the signal MASK is not compared with the corresponding bit of the predicted data word, but simply goes directly to the output of block 156. This effect may be achieved without any changes in hardware. When a particular encoding scheme allows, commands may be sent (through the pipeline) with DO_EXP values that may be expanded into all 0s. But this way may take multiple alterations in command sequences sent to the collars 108*a*-108*n* via the pipeline.

To minimize the alterations (e.g., to use exactly the same command sequences both for regular testing/diagnostics and for observing, with the exception of some initializing parts), the netlists may be slightly modified to directly support the observation mode. The modification may include:

(i) replacing the diagnostic mode flag (maintained in the transport portion 132*a*-132*n* of each of the collars 108*a*-108*n* and used in the memory-controlling portion 130*a*-130*n* with a 2-bit pair (DIAG_MODE; OBS), where the sub-flag OBS is meaningful only when DIAG_MODE=1;

(ii) respective modification in the pipeline protocol: the command for setting ACTIVE and DIAG_MODE now includes the 3rd parameter for setting OBS;

(iii) adding a few more wires and gates to the block 156 (e.g., the blocks 214 and 216).

The above changes generally have no effect when OBS=0; but when DIAG_MODE=OBS=1 is set simultaneously, the output of the data expander 200 may be completely masked out, and the desired output bit may go unchanged through the rest of module to the output signal CURR_ERR.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals. The various signals of the present invention are generally shown on individual inputs and outputs. In other embodiments, some or all of the various signals may be multiplexed through one or more inputs and/or outputs as desired or needed. The various signals of the present invention may be implemented as single-bit or multi-bit signals in a serial and/or parallel configuration. As would be apparent to those skilled in the relevant art(s), the signals illustrated in FIGS. 1-6 represent logical data flows. The logical data flows may be generally representative of physical data transferred between the respective blocks by, for example, address, data, and control signals and/or busses. The system represented by the circuit 100 may be implemented in hardware, software or a combination of hardware and software according to the teachings of the present disclosure, as would be apparent to those skilled in the relevant art(s).

While the invention has been particularly shown and described with reference to the preferred embodiments thereof, it will be understood by those skilled in the art that various changes in form and details may be made without departing from the scope of the invention.

The invention claimed is:

1. A memory collar comprising:
 a first circuit comprising a command decoder and configured to generate one or more data sequences in response to one or more test commands, wherein said one or more data sequences are presented to a memory during a test mode; and
 a second circuit configured to pre-process one or more outputs generated by said memory in response to said one or more data sequences, wherein said command decoder is configured to (i) receive the one or more test commands, (ii) present a signal indicating a current metaphase, (iii) present an address generation control signal configured to control generation of one or more addresses, (iv) present a signal indicating a data encoding scheme in use, (v) present a signal configured to control which bits received from the memory are processed by said second circuit, and (vi) present a signal comprising data-related parts of said one or more test commands.

2. The memory collar according to claim 1, further comprising a transport portion configured to (i) communicate said test command from a controller to said first circuit and (ii) communicate a result of pre-processing said one or more outputs to said controller.

3. The memory collar according to claim 1, wherein said first circuit further comprises:
 one or more address controlling modules configured to generate (i) active and passive address signals and (ii) active and passive address validity signals in response to the address generation control signal from the command decoder.

4. The memory collar according to claim 3, wherein said first circuit further comprises:
 a data controlling logic configured to (i) receive the signal comprising the data-related parts of the one or more test commands from the command decoder, (ii) present data and related control signals, (iii) present a signal comprising packed expected data output values for use in testing the memory, and (iv) present a control signal configured to control a comparison mode of said second circuit.

5. The memory collar according to claim 4, further comprising:
 one or more data loaders, each configured to (i) receive the data and related control signals from the data controlling logic, (ii) receive the address signals from the one or more address controlling modules, (iii) receive a signal configured to select between a test and a user mode, (iv) receive the signal indicating the data encoding scheme in use, (v) receive a respective one of a plurality of first select signals configured to indicate an active mode, (vi) receive a respective one of a plurality of second select signals configured to indicate a passive mode, and (vii) present said one or more data sequences to a respective input of the memory.

6. The memory collar according to claim 1, further comprising:
 a first register configured to store the current metaphase indicated by the command decoder;
 a second register configured to store the signal indicating the data encoding scheme in use; and
 a third register configured to store the signal configured to control which bits received from the memory are processed by said second circuit.

7. The memory collar according to claim 1, wherein said second circuit comprises a data analyzer and compactor circuit.

8. The memory collar according to claim 1, wherein said second circuit comprises:
 a first register configured to store a definition of a current encoding scheme;
 a second register configured to store packed data; and
 a data expander configured to generate an output in response to said packed data and said definition of said current encoding scheme.

9. The memory collar according to claim 8, wherein said second circuit further comprises:
 a multiplexing circuit configured to select one of a plurality of inputs in response to a plurality of select signals, wherein the plurality of inputs comprise said outputs generated by said memory in response to said one or more data sequences; and
 a data analyzer configured to generate a status signal in response to an output of said multiplexing circuit, a first control signal configured to indicate an active operating mode, a second control signal configured to indicate a diagnostic operating mode, and said output of said data expander.

10. The memory collar according to claim 9, wherein said data analyzer is further configured to generate said status signal in further response to a mask signal.

11. The memory collar according to claim 10, wherein said data analyzer has a first mode configured to generate said status signal and a second mode configured to pass raw data for observation, wherein said data analyzer switches between said first mode and said second mode in response to a state of a third control signal.

12. The memory collar according to claim 1, wherein said memory collar is coupled with a controller to form a memory built-in self test (MBIST) chain.

13. The memory collar according to claim 1, further comprising:
a port selection logic configured to (i) receive the signal indicating the current metaphase, (ii) receive a control signal indicating an active operating mode, (iii) present a plurality of first select signals configured to indicate an active mode, and (iv) present a plurality of second select signals configured to indicate a passive mode.

14. An apparatus comprising:
a controller configured to generate one or more test commands;
one or more memory collars, each configured to (i) generate one or more data sequences in response to said one or more test commands and (ii) pre-process one or more outputs generated by a respective memory in response to said one or more data sequences, wherein said data sequences are presented to said respective memory during a test mode and each of said one or more memory collars comprise a command decoder configured to (i) receive the one or more test commands, (ii) present a signal indicating a current metaphase, (iii) present an address generation control signal configured to control generation of one or more addresses, (iv) present a signal indicating a data encoding scheme in use, (v) present a signal configured to control which bits received from the memory are processed, and (vi) present a signal comprising data-related parts of said one or more test commands.

15. The apparatus according to claim 14, wherein said one or more memory collars further comprise one or more address controlling modules configured to generate (i) active and passive address signals and (ii) active and passive address validity signals in response to the address generation control signal from the command decoder.

16. A method to control data in a memory built-in self test (MBIST) chain comprising:
generating one or more data sequences in a memory collar in response to one or more test commands, wherein said memory collar comprises a command decoder configured to (i) receive the one or more test commands, (ii) present a signal indicating a current metaphase, (iii) present an address generation control signal configured to control generation of one or more addresses, (iv) present a signal indicating a data encoding scheme in use, (v) present a signal configured to control which bits received from a memory are processed, and (vi) present a signal comprising data-related parts of said one or more test commands;
presenting said data sequences to said memory during a test mode; and
pre-processing one or more outputs generated by said memory in response to said one or more data sequences in said memory collar.

17. The method according to claim 16, further comprising:
controlling one or more ports of a memory according to one or more metaphases.

18. The method according to claim 17, further comprising:
generating a plurality of metaphases to test all port pair combinations of said one or more ports of said memory.

19. The method according to claim 16, further comprising:
presenting a status signal in response to a first state of a control signal, wherein said status signal is generated in response to an output from said memory and an output of a data expander; and
presenting raw data in response to a second state of said control signal.

20. The method according to claim 19, wherein said data expander is configured to generate said output in response to packed data and a definition of a current encoding scheme.

21. The method according to claim 19, wherein said status signal is generated in further response to a mask signal.

22. The method according to claim 19, wherein the raw data presented is determined by a mask signal.

23. The method according to claim 16, further comprising:
communicating said test commands from a controller to a plurality of memory collars via a transport pipeline.

24. The method according to claim 16, further comprising:
communicating results of pre-processing one or more outputs generated by a plurality of memories from a plurality of memory collars to a controller via a transport pipeline.

25. A memory collar comprising:
a first circuit configured to generate one or more data sequences in response to one or more test commands, wherein said one or more data sequences are presented to a memory during a test mode; and
a second circuit configured to pre-process one or more outputs generated by said memory in response to said one or more data sequences, wherein said second circuit comprises an analyzer configured to generate a status signal in response to a selected one of said outputs generated by said memory in response to said one or more data sequences, a first control signal configured to indicate an active operating mode, a second control signal configured to indicate a diagnostic operating mode, and one or more expected data values.

26. The memory collar according to claim 25, wherein said analyzer is further configured to generate said status signal in further response to a mask signal.

27. The memory collar according to claim 25, wherein said analyzer has a first mode configured to generate said status signal and a second mode configured to pass raw data for observation, wherein said analyzer switches between said first mode and said second mode in response to a state of a third control signal.

28. The memory collar according to claim 25, wherein said second circuit further comprises:
a first register configured to store a definition of a current encoding scheme;
a second register configured to store packed data; and
a data expander configured to generate an output comprising said one or more expected data values in response to said packed data and said definition of said current encoding scheme.

29. The memory collar according to claim 25, wherein said second circuit further comprises:
a multiplexing circuit configured to select one of a plurality of inputs in response to a plurality of select signals, wherein the plurality of inputs comprise said outputs generated by said memory in response to said one or more data sequences.

* * * * *